(12) United States Patent
Yu et al.

(10) Patent No.: US 9,659,925 B2
(45) Date of Patent: May 23, 2017

(54) DISPLAY PANEL

(71) Applicant: INNOLUX CORPORATION, Miao-Li County (TW)

(72) Inventors: Yi-Ling Yu, Miao-Li County (TW); Wei-Ching Cho, Miao-Li County (TW); Hsia-Ching Chu, Miao-Li County (TW); Peng-Cheng Huang, Miao-Li County (TW); Yi-Hung Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/089,747

(22) Filed: Apr. 4, 2016

(65) Prior Publication Data
US 2016/0300834 A1 Oct. 13, 2016

(30) Foreign Application Priority Data
Apr. 7, 2015 (TW) .............................. 104111097 A

(51) Int. Cl.
*H01L 27/02* (2006.01)
*H01L 27/12* (2006.01)
(52) U.S. Cl.
CPC ........ *H01L 27/0288* (2013.01); *H01L 27/124* (2013.01); *H01L 27/1225* (2013.01)

(58) Field of Classification Search
CPC ............. H01L 27/0292; H01L 27/0288; H01L 27/0248; H01L 27/124
See application file for complete search history.

(56) References Cited

U.S. PATENT DOCUMENTS

| | | | | |
|---|---|---|---|---|
| 5,929,829 A | * | 7/1999 | Pitt ................... | G02F 1/136204 345/87 |
| 7,782,411 B2 | * | 8/2010 | Shie .................... | G02F 1/13452 349/139 |
| 2005/0023614 A1 | * | 2/2005 | Lai ..................... | H01L 27/0251 257/360 |

* cited by examiner

*Primary Examiner* — Matthew Reames
(74) *Attorney, Agent, or Firm* — Li & Cai Intellectual Property (USA) Office

(57) ABSTRACT

A display panel includes a substrate, a first stacking unit, and a second stacking unit. The first stacking unit is disposed on the substrate and connected to a scan line. The first stacking unit includes a first conducting layer, a second conducting layer, at least one first through hole, and a first protruding portion. The first conducting layer is interposed between the second conducting layer and the substrate. The first through hole connects the first conducting layer and the second conducting layer. The position of the first protruding portion is relative to the position of the second protruding portion.

18 Claims, 5 Drawing Sheets

DISPLAY PANEL

BACKGROUND

1. Field of the Invention

The instant disclosure relates to a structure of a display panel, in particular, to a display panel which has electrostatic protection.

2. Description of Related Art

At present, most thin film transistor liquid crystal displays include an active element array substrate, color filter and backlight module. The active element array substrate is formed by disposing the thin film transistor on the substrate, and the thin film transistor is used to control the voltage of sub-pixel to adjust the deflection angle of a crystal molecule and then determine the grey scale of the sub-pixel through a polarizer, emitting the sub-pixel with red, blue and green color to form an image.

In general, in the processing procedure of fabricating a thin film transistor liquid crystal display, each step may result in static electricity charges accumulation. When the static electricity charges existing in the active element array substrate accumulate to such extent, the static electricity accumulation always causes massive electro-static discharge, which makes the internal elements or wires become damaged or punctured. Therefore, it is more and more important to make electrostatic protection in a display.

SUMMARY OF THE INVENTION

The embodiment of the instant disclosure provides a display panel which has a first stacking unit and a second stacking unit, and the first stacking unit and the second stacking unit can decrease the phenomenon of the electrostatic discharge in the display area.

One of the embodiments of the instant disclosure provides a display panel which includes a substrate, a first stacking unit and a second stacking unit. The substrate includes the display area and non-display area. The first stacking unit is disposed on the substrate and located on the non-display area. The first stacking unit is connected to the scan line extending from the display area to the non-display area. The first stacking unit includes a first conductive layer, a second conductive layer, and at least one first through hole and a first protruding portion. The first conductive layer is interposed between the second conductive layer and the substrate. The second conductive layer is electrically connected to the first conductive layer through the first through hole. The first protruding portion is connected to at least one of the first conductive layer and the second conductive layer.

The second stacking unit is disposed on the substrate and located in the non-display area. The second stacking unit comprises a third conductive layer, a fourth conductive layer, a semiconductor layer, at least one second through hole and a second protruding portion. The third conductive layer is interposed between the fourth conductive layer and the substrate. The semiconductor layer is interposed between the third conductive layer and fourth conductive layer. The third conductive layer is electrically connected to the fourth conductive layer through the second through hole. The second protruding portion is connected to at least one of the third conductive layer and fourth conductive layer. The first protruding portion and the second protruding portion are correspondingly disposed.

In summary, the embodiment of the instant disclosure provides a display panel comprising the first stacking unit and the second stacking unit. The second protruding portion of the second stacking unit and the first protruding portion of the first stacking unit are correspondingly disposed so that the electric charges accumulating on the tip of the first protruding portion can neutralize with the electric charges accumulating on the second protruding portion through corona discharge.

It is worth to mention that the first stacking unit has the first through hole and the second stacking unit has the second through hole and the third through hole. The surplus un-neutralized electric charges can transfer to the other second stacking unit through the connection portion of the second protruding portion of the third conductive layer and then flow out. In addition, the surplus un-neutralized electric charges can transfer to the fourth conductive layer from the third conductive layer through the second through hole and then flow out. Moreover, the surplus un-neutralized electric charges can also transfer from the third conductive layer to the semiconductor layer through the third through hole, and then accumulate and store in the semiconductor layer.

In addition, if the surplus un-neutralized electric charge cannot transfer from the third conductive layer to the fourth conductive layer through the second through hole and flow out due to the process failure, a third through hole can be processed, such as drilling through the semiconductor layer by a laser to allow the fourth conductive layer to weld with the third conductive layer. Therefore, the surplus un-neutralized electric charges can transfer from the third conductive layer to the fourth conductive layer by the processed third through hole and then flow out.

Moreover, the display panel can further comprise a semiconductor component. The semiconductor component is connected to the first stacking unit and the second stacking unit. The surplus un-neutralized electric charges from the display area can also flow out by the semiconductor component, which helps the element to avoid damage from static electricity accumulation.

Furthermore, in order to avoid corona discharge happening outside the first protruding portion or outside the second protruding portion, the corners of the first conductive layer, the second conductive layer, the third conductive layer and the fourth conductive layer can be chamfered corners.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

DETAILED DESCRIPTION OF THE PREFERRED EMBODIMENTS

Figure 1:
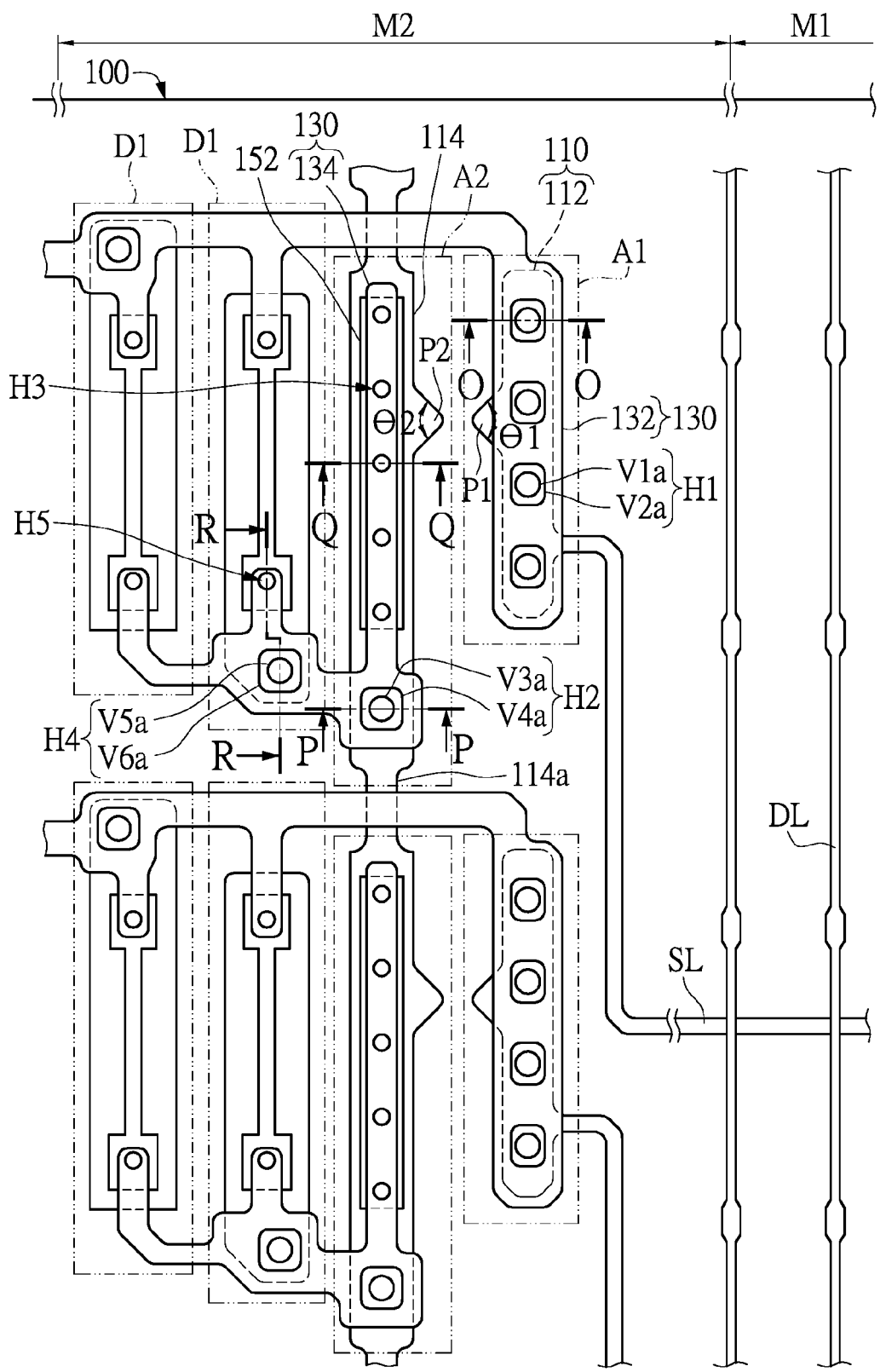
FIG. 1 is a partial schematic plan view of a display panel in first embodiment of the instant disclosure.

In the accompanying drawings show some exemplary embodiments, and a more detailed description of various embodiments with reference to the accompanying drawings in accordance with the present disclosure is set forth below. It is worth to know that the concept of the invention may be embodied in many different forms and is not to be construed as limited to the embodiment set forth herein. To be more precise, the exemplary embodiments set forth herein are provided to a person of ordinary skill in the art to thoroughly and completely understand the contents disclosed herein and fully provide the spirit of the invention. In each of the drawings, the relative size, proportions, and depiction of the layers and regions in the drawings may be exaggerated for clarity and precision, in which like numerals indicate like elements.

FIG. 1 is a partial schematic plan view of a display panel in first embodiment of the instant disclosure. In general, the display panel can be a liquid crystal panel or an organic light emitting diode display panel. Taking a liquid crystal panel for example, a liquid crystal layer is approximately sealed between a substrate 100 and an opposite substrate. The substrate 100 has a display area M1 and a non-display area M2, and the non-display area M2 surrounds the display area M1. The non-display area M2 comprises a peripheral wiring region within the gate drive circuit and the data drive circuit. An active element array, a plurality of scan lines SL and a plurality of data lines DL, at least one first stacking unit A1 and at least one second stacking unit A2 are disposed on the substrate 100. The scan lines SL extend from the display area M1 to the non-display area M2 along the row direction and are parallel with each other, and the data lines DL extend from the display area M1 to the non-display area M2 along the column direction and are parallel with each other. These scan lines SL and data lines DL intersect each other and are arranged in a stacking manner, defining a plurality of sub pixel units. Each active element is disposed in the display area M1 and located on the intersection of the scan line SL and the data line DL. The first stacking unit A1 and the second stacking unit A2 are both located in the non-display area M2 and arranged correspondingly. The first stacking unit A1 is connected to the scan line SL extending from the display area M1 to the non-display area M2.

Figure 2:
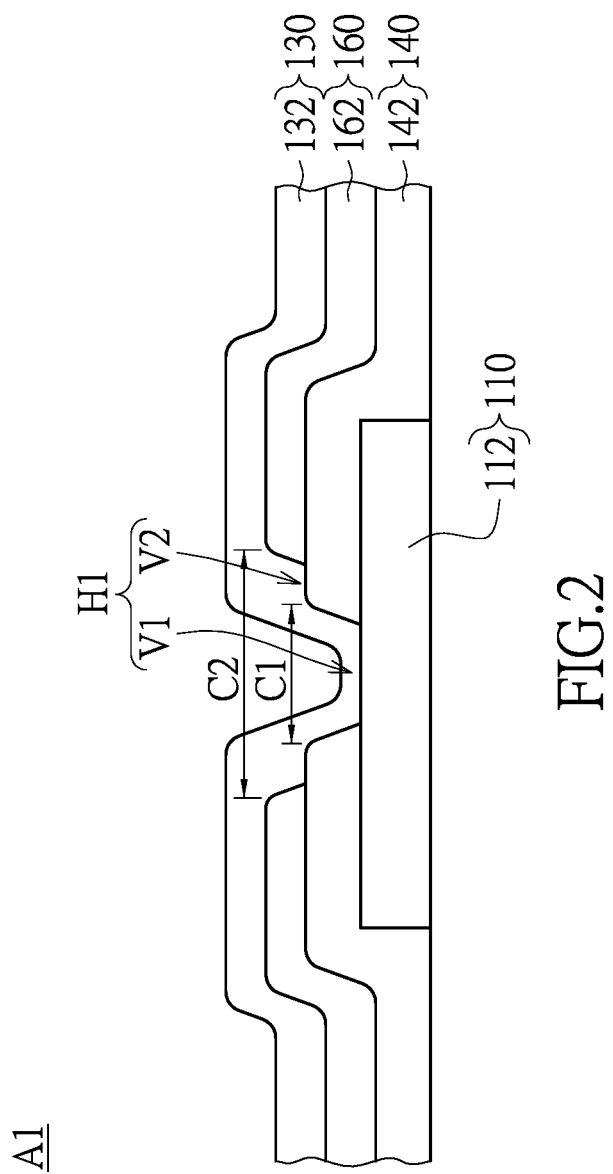
FIG. 2 illustrates a cross-sectional view along the line O-O of FIG. 1.

FIG. 2 illustrates a cross-sectional view along the line O-O of FIG. 1. Please refer to FIG. 2 accompanied with FIG. 1. The first stacking unit A1 includes a first conductive layer 112 and a second conductive layer 132. The first conductive layer 112 is disposed on the substrate 100, and the second conductive layer 132 is disposed on the first conductive layer 112, namely, the first conductive layer 112 is interposed between the second conductive layer 132 and the substrate 100. The second conductive layer 132 is substantially disposed on the first conductive layer 112 in stacking manner. When looking toward the substrate 100 from the counter substrate in plan-view, the geometric center of the first conductive layer 112 does not overlap with the geometric center of the second conductive layer 132 along the direction perpendicular to the substrate 100. In order words, the edge of the first conductive layer 112 is not corresponding with the edge of the second conductive layer 132, namely, the edge of the first conductive layer 112 and the edge of the second conductive layer 132 are staggered.

The first conductive layer is connected to the scan line SL. In practice, the first conductive layer 112 and the scan line SL both belong to an identical layer of the conductive layer 110. Therefore, the first conductive layer 112 and the scan line SL can be formed through the same processing procedure. In addition, practically, the second conductive layer 132 and the data line DL both belong to an identical layer of the conductive layer 130. Therefore, the second conductive layer 132 and the data line DL can be formed through the same processing procedure.

The first stacking unit A1 can comprise the first insulating layer 142. The first insulating layer 142 is disposed on the first conductive layer 112. Practically, the first insulating layer 142 and the gate insulating layer (GIL) are connected with each other and belong to an identical layer of the insulating layer 140. The first insulating layer 142 forms the first opening V1. The first opening V1 exposes part of the first conductive layer 112.

In addition, the first stacking unit A1 can further comprise a second insulating layer 162 disposed on the first insulating layer 142, and the first insulating layer 142 and the second insulating layer 162 are interposed between the first conductive layer 112 and the second conductive layer 132. In practice, the second insulating layer 162 and the etch stop layer (ESL) are connected to each other and belong to the identical layer of the insulating layer 160. The second insulating layer 162 has the second opening V2, and the position of the second opening V2 is in alignment with the position of the first opening V1. The first through hole H1 includes the first opening V1 and the second opening V2. The first through hole H1 exposes part of the first conductive layer 112. The second conductive layer 132 is electrically connected to the first conductive layer 112 through the first through hole H1. In order words, the first conductive layer 112 is in contact with the second conductive layer 132 through the first through hole H1.

Specifically, the first opening V1 has the first aperture edge V1a in a surface of the second insulating layer 162. The dimension of the aperture C1 of the first opening V1 is defined by the first aperture edge V1a. The second opening V2 has the second aperture edge V2a in a surface of the second conductive layer 132. The dimension of the aperture C2 of the first opening V2 is defined by the second aperture edge V2a. The aperture C2 of the second opening V2 has larger dimension than that of the aperture C1 of the first opening V1. The diameters of the upper and bottom ends of the first through hole H1 can be adjusted according to the process requirements, i.e, the diameters of the upper and bottom ends of the first through hole H1 can be the same or not.

In this embodiment, the first protruding portion P1 and the first conductive layer 112 are connected and belong to an identical layer. The first protruding portion P1 has a tip. The tip of the first protruding portion P1 has first angel θ1 which ranges between 1 degree (°) and 170 degrees (°). Preferably, the range of the angle is between 40 degrees (°) and 140 degrees (°). However, in another embodiment, the first protruding portion P1 can be connected to the second conductive layer 132, and the first protruding portion P1 and the second conductive layer 132 belong to an identical layer. The present invention is not limited to the connection relation of the first protruding portion P1, the first conductive layer 112, and the second conductive layer 132.

Figure 3A:
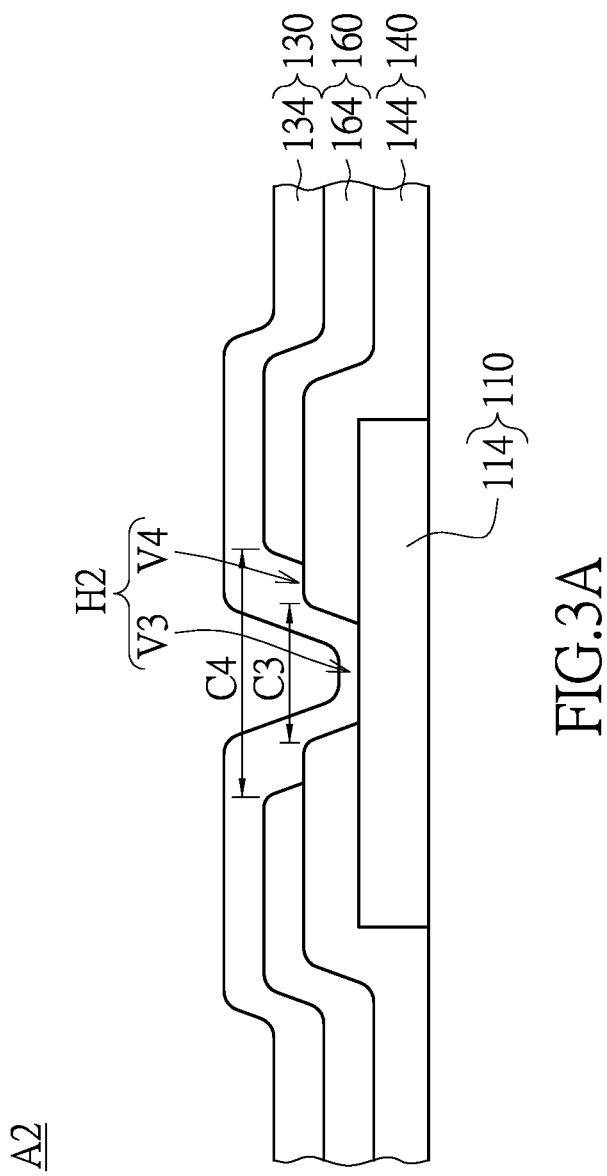
FIG. 3A illustrates a cross-sectional view along the line P-P of FIG. 1.
Figure 3B:
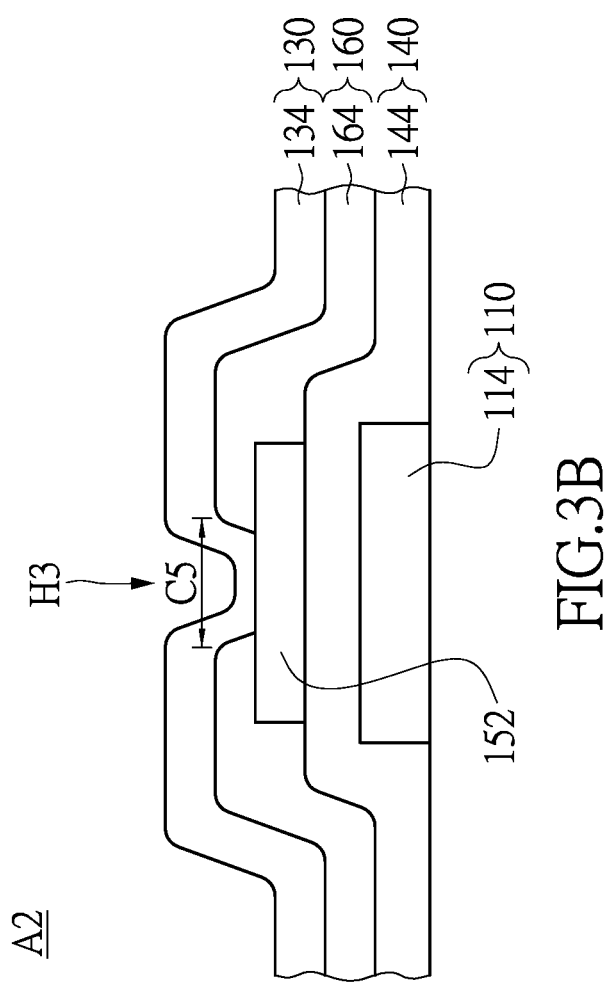
FIG. 3B illustrates a cross-sectional view along the line Q-Q of FIG. 1.

FIG. 3A illustrates a cross-sectional view along the line P-P of FIG. 1. FIG. 3B illustrates a cross-sectional view along the line Q-Q of FIG. 1. Please refer to FIGS. 3A and 3B accompanied with FIG. 1. The second stacking unit A2 comprises a third conductive layer 114, a fourth conductive layer 134 and a semiconductor layer 152. The third conductive layer 114 is disposed on the substrate 100, and the fourth conductive layer 134 is disposed upon the third conductive layer 114, and the semiconductor layer 152 is interposed between the third conductive layer 114 and fourth conductive layer 134.

In practice, the third conductive layer 114, the first conductive layer 112 and the scan line SL belong to an identical layer of the conductive layer 110. Therefore, the third conductive layer 114, the first conductive layer 112 and the scan line SL can be formed by the same processing procedure. In addition, practically, the fourth conductive layer 134, the second conductive layer 132 and the data line DL belong to an identical layer of the conductive layer 130. Therefore, the fourth conductive layer 134, the second conductive layer 132 and the data line DL can be formed by the same processing procedure.

The two adjacent stacking units A2 are connected to each other through the third conductive layer 114 along with the direction perpendicular to the extension direction of the scan line SL. Specifically, the third conductive layer 114 of the second stacking unit A2 has at least one connection portion 114a. Each second stacking unit A2 is connected with each other through each connection portion 114a. It is worth to mention that the conductive layer 130 stretching from the second conductive layer 132 will cross the connection portion 114a. Therefore, the width of the connection portion 114a of the third conductive layer 114 is smaller than the width of the conductive layer 114 outside the connection portion 114a so as to reduce the parasitic capacitance existing in the intersection of the conductive layer 130 and the conductive layer 110.

The second stacking unit A2 can include a third insulating layer 144. The third insulating layer 144 covers the third conductive layer 114 and is interposed between the third conductive layer 114 and the semiconductor layer 152. In practice, the third insulating layer 144, the first insulating layer 142 and the gate insulating layer are all connected with each other and belong to an identical layer of the insulating layer 140. As shown in FIG. 3A, the third insulating layer 144 forms a third open V3. The third open V3 exposes part of the third conductive layer 114.

The semiconductor layer 152 is interposed between the third conductive layer 114 and the fourth conductive layer 134. Please refer to FIG. 3B. The semiconductor layer 152 is located upon the third insulating layer 144. In practice, the semiconductor layer 152 and the channel layer belong to an identical layer. Therefore, the materials of the semiconductor layer 152 can be selected from one of the combinations of polysilicon layer, metal oxide semiconductor layer or amorphous silicon layer. In this embodiment, the materials of the semiconductor layer 152 can be selected from indium-gallium-zinc oxide (IGZO), zinc oxide (ZnO), stannous oxide (SnO), indium-zinc oxide (IZO), gallium-zinc oxide (GaZnO), zinc-tin oxide (ZTO), indium-tin oxide (ITO) or mixtures thereof. In this embodiment, the material of the semiconductor layer 152 is indium-gallium-zinc oxide. However, the present invention is not limited to the material of the semiconductor layer 152.

In addition, the second stacking unit A2 can further include a fourth insulating layer 164 located on the semiconductor layer 152 and the third insulating layer 144. The third insulating layer 144, the semiconductor layer 152 and the fourth insulating layer 164 are all located between the first conductive layer 112 and the second conductive layer 132. In practice, the fourth insulating layer 164, the second insulating layer 162 and the etch stop layer are all connected with each other and belong to an identical layer of the insulating layer 160. As shown in FIG. 3A, the fourth insulating layer 164 has a fourth opening V4. The position of the fourth opening V4 is corresponding to or in alignment with the position of the third opening V3. The second through hole H2 comprises the third opening V3 and the fourth opening V4. The second through hole H2 exposes part of the third conductive layer 114. The fourth conductive layer 134 passes through the second through hole H2 and is in contact with the third conductive layer 114. In other words, the third conductive layer 114 is electrically connected to the fourth conductive layer 134 through the second through hole H2.

Specifically, the third opening V3 has a third aperture edge V3a in a surface of the third insulating layer 144. The dimension of the aperture C3 of the third opening V3 is defined by the third aperture edge V3a. The fourth opening V4 has a fourth aperture edge V4a in a surface of the fourth insulating layer 164. The dimension of the aperture C4 of the fourth opening V4 is defined by the fourth aperture edge V4a. The aperture C4 of the fourth opening V4 has the larger dimension than that of the aperture C3 of the first opening V3. The diameters of the upper and bottom ends of the second through hole H2 can be adjusted according to the process requirements, i.e, the diameters of the upper and bottom ends of the second through hole H2 can be the same or not.

Please refer to FIG. 3B. The fourth insulating layer 164 can has a third through hole H3. The third through hole H3 exposes part of the semiconductor layer 152. The fourth conductive layer 134 passes through the third through hole H3 and connects to the semiconductor layer 152. The maximum aperture of the second through hole H2 is the aperture C4 of the fourth opening V4. Preferably, the aperture C4 is larger than the aperture C5 of the third through hole H3.

In this embodiment, the second protruding portion P2 and the third conductive layer 114 are connected and belong to an identical layer. The second protruding portion P2 comprises a tip. The tip of the second protruding portion P2 has second angel $\theta2$ which ranges between 1 degree (°) and 170 degrees (°). Preferably, the range of the angle is between 40 degrees (°) and 140 degrees (°). However, in another embodiment, the second protruding portion P2 can connect with the fourth conductive layer 134 and belongs to an identical layer. The present invention is not limited to the connection relation of the second protruding portion P2, the third conductive layer 114, and the fourth conductive layer 134 structure Specifically, the second protruding portion P2 and the first protruding portion P1 are correspondingly disposed. That is, the second protruding portion P2 and the first protruding portion P1 are disposed facing to each other. In one embodiment, the position of the second protruding portion P2 is in alignment with the position of the first protruding portion P1. It is worth to mention that the interval between the first protruding portion P1 and the second protruding portion P2 ranges from 0.1 to 20 micrometer, and preferably ranges from 0.1 to 10 micrometer (μm). When there is an abnormal charge accumulation in the display area M1, the charge accumulating in the display panel will transfer from the display area M1 to the first protruding portion P1 in the non-display area through the scan line SL. Those charges in the tip of the first protruding portion P1 induce an accumulation of the electric charges in the tip of the second protruding portion P2 having opposite polarity to that of the charges in the tip of the first protruding portion P1. Therefore, the charges in the tip of the first protruding portion P1 may neutralize with the charges in the tip of the second protruding portion P2 through corona discharge.

It is worth to mention that the surplus un-neutralized electric charges can flow out in three ways, which could prevent the elements from damage caused by the static electricity accumulation. First, the surplus un-neutralized electric charges can transfer from the connection portion 114a of the second protruding portion P2 of the third conductive layer 114 to another second stacking unit A2 and then flow out. Second, the surplus un-neutralized electric charges can transfer from the third conductive layer 114 to the fourth conductive layer 134 through the second through hole H2 and then flow out. Third, the surplus un-neutralized electric charges can transfer from the third conductive layer 114 to the semiconductor layer 152 through the third through hole H3 and then accumulate and be stored in the semiconductor layer 152.

Furthermore, the discharge of massive accumulated electrostatic charges between the first stacking unit A1 and the second stacking unit A2 may result in the structural damages of the first through hole H1, the second through hole H2 or the third through hole H3 nearest to the tip. In order to prevent the structural damages of the first through hole H1, the second through hole H2 and the third hole H3, the first protruding portion P1 laterally protrudes from a section between the two adjacent first through holes H1, and the second protruding portion P2 laterally protrudes from a section between two adjacent third through holes H3. Specifically, the tip of the first protruding portion P1 is arranged without in alignment with the first through hole H1, and the tip of the second protruding portion P2 is arranged without in alignment with the second through hole H2.

In addition, if the surplus un-neutralized electric charges cannot transfer from the third conductive layer 114 to the fourth conductive layer 134 through the second through hole H2 and flow out due to the process failure, the third through hole H3 can be processed. For example, the semiconductor layer 152 can be drilled through by a laser to allow the fourth conductive layer 134 to weld with the third conductive layer 114. Therefore, the surplus un-neutralized electric charges can transfer from the third conductive layer 114 to the fourth conductive layer 134 by the processed third through hole H3 and then flow out.

In addition, in order to avoid the discharging happening outside the first protruding portion P1 or outside the second protruding portion P2, the corner of each of the first conductive layer 112, the second conductive layer 132, the third conductive layer 114 and the fourth conductive layer 134 can be a chamfered corner.

Figure 4:
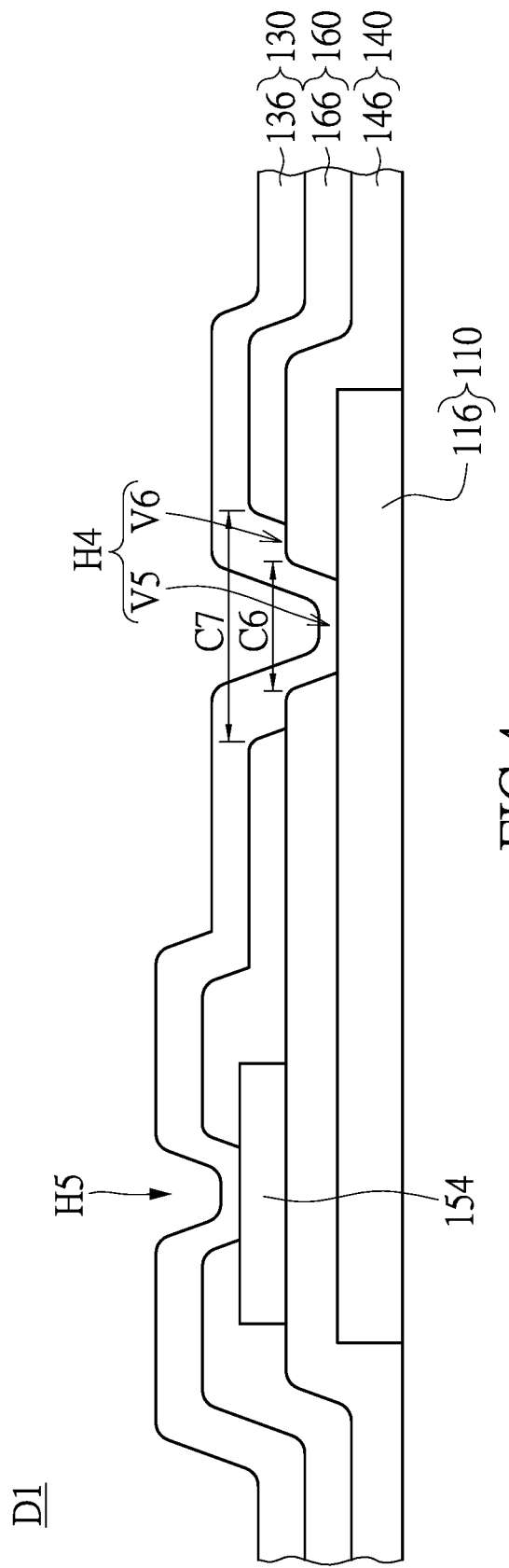
FIG. 4 illustrates a cross-sectional view along the line R-R of FIG. 1.

FIG. 4 illustrates a cross-sectional view along the line R-R of FIG. 1. Please refer FIG. 4 accompanied FIG. 1. The display panel further includes at least one semiconductor component D1 located in the non-display area M2. The semiconductor component D1 is connected to the first stacking unit A1 and the second stacking unit A2. The semiconductor component D1 is a kind of diode. The surplus charges from the display area M1 can flow out through the semiconductor component D1, which helps the element to avoid the damage from static electricity accumulation.

Specifically, the semiconductor component D1 includes a fifth conductive layer 116, a sixth conductive layer 136 and a second semiconductor layer 154. The fifth conductive layer 116 is disposed on the substrate 100. The sixth conductive layer 136 is located on the fifth conductive layer 116. The second semiconductor layer 154 is interposed between the fifth conductive layer 116 and the sixth conductive layer 136.

In practice, the fifth conductive layer 116, the third conductive layer 114 and the first conductive layer 112 and the scan line SL are all connected with each other and belong to the identical layer of the conductive layer 110. The sixth conductive layer 136, the fourth conductive layer 134, the second conductive layer 132 and the data line DL belong to the identical layer of the conductive layer 130. Moreover, the second semiconductor layer 154, the semiconductor layer 152 and the channel layer belong to an identical layer. Therefore, the structures of the identical layers can be formed through the same processing procedure respectively.

The semiconductor component D1 can include the fifth insulating layer 146. The fifth insulating layer 146 covers the fifth conductive layer 116 and is interposed between the fifth conductive layer 116 and the second semiconductor layer 154. In practice, the fifth insulating layer 146, the third insulating layer 144, the first insulating layer 142 and the gate insulating layer are all connected with each other and belong to the identical layer of the insulating layer 140. As shown in FIG. 4, the fifth insulating layer 146 forms a fifth opening V5. The fifth opening V5 exposes part of the fifth conductive layer 116.

The second semiconductor layer 154 is located on the fifth insulating layer 146. Similarly, the materials of the second semiconductor layer 154 can be selected from one of the combinations of polysilicon layer, metal oxide semiconductor layer or amorphous silicon layer. In this embodiment, the materials of the semiconductor layer 152 can be selected from indium-gallium-zinc oxide, zinc oxide, stannous oxide, indium-zinc oxide, gallium-zinc oxide, zinc-tin oxide, indium-tin oxide or mixtures thereof. In this embodiment, the materials of the second semiconductor layer 154 and the semiconductor layer 152 are both indium-gallium-zinc oxide. However, the present invention does not limit the materials of the semiconductor layer 152 and the second semiconductor layer 154.

In addition, the semiconductor component D1 can further include the sixth insulating layer 166 located on the second semiconductor layer 154 and the fifth insulating layer 146. The fifth insulating layer 146, the second semiconductor layer 154 and the sixth insulating layer 166 are all interposed between the fifth conductive layer 116 and the sixth conductive layer 136. In practice, the sixth insulating layer 166, the fourth insulating layer 164, the second insulating layer 162 and the etch stop layer are all connected with each other and belong to the identical layer of the insulating layer 160. The sixth insulating layer 166 forms a sixth opening V6. The position of the sixth opening V6 is corresponding to the position of the fifth opening V5. The fourth through hole H4 includes the fifth opening V5 and the sixth opening V6. The fourth through hole H4 exposes part of the fifth conductive layer 116. The sixth conductive layer 136 passes through the fourth through hole H4 and connects with the fifth conductive layer 116.

Specifically, the fifth opening V5 has the fifth aperture edge V5a on a surface of the fifth insulating layer 146. The dimension of the aperture C6 of the fifth opening V5 is defined by the fifth aperture edge V5a. The sixth opening V6 has the sixth aperture edge V6a on a surface of the sixth insulating layer. The dimension of the aperture C7 of the first opening V6 is defined by the sixth aperture edge V6a. The aperture C7 of the sixth open V6 has larger dimension than that of the aperture C6 of the fifth open V5. The diameters of the upper and bottom ends of the fourth through hole H4 can be adjusted according to the process requirements, i.e, the diameters of the upper and bottom ends of the fourth through hole H4 can be the same or not.

The sixth insulating layer 166 can form a fifth through hole H5. The fifth through hole H5 exposes part of the second semiconductor layer 154. The sixth conductive layer 136 passes through the fifth through hole H5 and connects with the second semiconductor layer 154.

In summary, the embodiment of the instant disclosure provides a display panel including the first stacking unit and the second stacking unit. The second protruding portion of the second stacking unit and the first protruding portion of the first stacking unit are correspondingly disposed so that the electric charges on the tip of the first protruding portion can neutralize with the electric charges of the second protruding portion through corona discharge.

It is worth to mention that the first stacking unit has a first through hole and the second stacking unit has a second through hole and a third through hole. The surplus un-neutralized electric charges can transfer to the other second stacking unit through the connection portion of the second protruding portion of the third conductive layer and then flow out. In addition, the surplus un-neutralized electric charges can transfer to the fourth conductive layer from the third conductive layer through the second through hole and then flow out. Moreover, the surplus un-neutralized electric charges can also transfer from the third conductive layer to the semiconductor layer through the third through hole, and then accumulate and store in the semiconductor layer.

In addition, if the surplus un-neutralized electric charge cannot transfer from the third conductive layer to the fourth conductive layer through the second through hole and flow out due to the process failure, the third through hole can be processed. For example, the semiconductor layer can be drilled through by a laser to allow the fourth conductive layer to weld with the third conductive layer. Therefore, the surplus un-neutralized electric charges can transfer from the third conductive layer to the fourth conductive layer by the processed third through hole and then flow out.

Moreover, the display panel can further comprise a semiconductor component. The semiconductor component is connected to the first stacking unit and the second stacking unit. The surplus un-neutralized electric charges from the display area can also flow out by the semiconductor component, which helps the element to avoid the damage from static electricity accumulation.

Furthermore, in order to avoid corona discharge happening outside the first protruding portion or outside the second protruding portion, the corners of the first conductive layer, the second conductive layer, the third conductive layer and the fourth conductive layer can be chamfered corners.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

What is claimed is:

1. A display panel, comprising:
a substrate having a display area and a non-display area;
a least one first stacking unit disposed on the substrate and located in the non-display area, wherein the first stacking unit is connected to a scan line extending from the display area to the non-display area, and the first stacking unit comprises:
a first conductive layer;
a second conductive layer electrically connected to the first conductive layer through at least one first through hole, wherein the first conductive layer is interposed between the second conductive layer and the substrate; and
a first protruding portion connected to at least one of the first conductive layer and the second conductive layer; and
at least one second stacking unit disposed on the substrate and located in the non-display area, wherein the second stacking unit comprises:
a third conductive layer;
a fourth conductive layer electrically connected to the third conductive layer through at least one second through hole, wherein the third conductive layer is interposed between the fourth conductive layer and the substrate;
a semiconductor layer interposed between the third conductive layer and the fourth conductive layer; and
a second protruding portion connected to at least one of the third conductive layer and the fourth conductive layer, wherein the first protruding portion and the second protruding portion are disposed facing to each other.

2. The display panel according to claim 1, wherein the first conductive layer is connected with the scan line.

3. The display panel according to claim 1, wherein the first protruding portion and the second protruding portion both have a tip, and at least one of the tips of the first protruding portion and the second protruding portion is in alignment with a section between the two adjacent first through holes or a section between the two adjacent second through holes.

4. The display panel according to claim 3, wherein the tip of the first protruding portion has a first angle, and the tip of the second protruding portion has a second angle, and the first angle and the second angle are both in a range between 1 degree and 170 degrees.

5. The display panel according to claim 3, wherein the first protruding portion and the second protruding portion are spaced from each other by an interval ranging between 0.1 and 10 micrometers.

6. The display panel according to claim 1, wherein an edge of the first conductive layer and an edge of the second conductive layer are staggered.

7. The display panel according to claim 1, the corners of the first stacking unit and the second stacking unit both are chamfered corners.

8. The display panel according to claim 1, wherein first stacking unit further includes a first insulating layer and a second insulating layer, and the first insulating layer is disposed on the first conductive layer and has a first opening, and the second insulating layer is disposed on the first insulating layer and has a second opening in fluid communication with the first opening, and the first through hole includes the first open and the second open.

9. The display panel according to claim 8, wherein the aperture of the second opening has a larger dimension than that of the aperture of the first opening.

10. The display panel according to claim 8, wherein the first opening has a first aperture, and the second opening has a second aperture, and the diameters of the first aperture and the second aperture of the first through hole is different.

11. The display panel according to claim 1, further comprising another second stacking unit, wherein the two second stacking units are adjacent to and connected to each other through the third conductive layer along with the direction perpendicular to the extension direction of the scan line.

12. The display panel according to claim 11, wherein the third conductive layer includes a connection portion, the two adjacent second stacking units are connected with each other through the connection portion, and the width of the connection portion has a width smaller than a width of the third conductive layer outside the connection portion.

13. The display panel according to claim 1, wherein the second stacking unit further includes a third insulating layer and a fourth insulating layer, and the third insulating layer covers the third conductive layer and has a third opening, and the fourth insulating layer is interposed between the third insulating layer and the fourth conductive layer and has a fourth opening corresponding to the third opening, and the second through hole includes the third opening and the fourth opening.

14. The display panel according to claim 13, wherein the aperture of the fourth opening has a larger dimension than a dimension of the aperture of the third opening.

15. The display panel according to claim 1, wherein the second stacking unit further includes a third insulating layer and a fourth insulating layer, and the third insulating layer is interposed between the third conductive layer and the semiconductor layer, and the fourth insulating layer is interposed between the semiconductor layer and the fourth conductive layer and has a third through hole, and the third through hole connects the semiconductor layer and the fourth conductive layer.

16. The display panel according to claim 1 wherein the display panel further includes at least one semiconductor component located in the non-display area, and the semiconductor component is connected to the first stacking unit and the second stacking unit.

17. The display panel according to claim 16, wherein the semiconductor component comprising:
- a fifth conductive layer located on the substrate and connected to the first conductive layer and the third conductive layer;
- a sixth conductive layer connected to the second conductive layer and the fourth conductive layer, wherein the fifth conductive layer is electrically connected to the sixth conductive layer through at least one fourth through hole; and
- a second semiconductor layer interposed between the fifth conductive layer and the sixth conductive layer, wherein the second semiconductor layer is electrically connected to the sixth conductive layer through at least one fifth through hole.

18. The display panel according to claim 1, wherein the semiconductor layer comprises metal oxide.

* * * * *